(12) United States Patent
Armstrong

(10) Patent No.: US 8,547,084 B2
(45) Date of Patent: Oct. 1, 2013

(54) VOLTAGE REFERENCE SELECTOR FOR USE IN CONJUNCTION WITH A MULTI-METER IN TAKING ELECTRICAL MEASUREMENTS FROM AN ELECTRICAL CONTROL PANEL

(76) Inventor: Eric A. Armstrong, Indianapolis, IN (US)

( * ) Notice: Subject to any disclaimer, the term of this patent is extended or adjusted under 35 U.S.C. 154(b) by 336 days.

(21) Appl. No.: 12/963,873

(22) Filed: Dec. 9, 2010

(65) Prior Publication Data

US 2012/0146624 A1 Jun. 14, 2012

(51) Int. Cl.
*G01R 5/14* (2006.01)
*G01R 5/16* (2006.01)
*G01R 13/00* (2006.01)

(52) U.S. Cl.
USPC ...................................... 324/140 R

(58) Field of Classification Search
USPC ...................................... 324/140 R
See application file for complete search history.

(56) References Cited

U.S. PATENT DOCUMENTS

| | | | |
|---|---|---|---|
| 2,468,449 A * | 4/1949 | Kleinschmidt | 324/140 R |
| 2,857,570 A * | 10/1958 | Simpson | 324/115 |
| 5,920,196 A | 7/1999 | Schaffer | |
| 6,765,390 B2 | 7/2004 | Elms | |
| 6,931,936 B2 * | 8/2005 | Raichle et al. | 73/753 |
| 7,030,624 B1 | 4/2006 | Love | |
| 7,079,040 B2 * | 7/2006 | Barton | 340/657 |
| 7,953,565 B2 * | 5/2011 | Kagan | 702/62 |
| 2009/0160663 A1 | 6/2009 | Silverman et al. | |

* cited by examiner

*Primary Examiner* — Jermele M Hollington
*Assistant Examiner* — Demetrius Pretlow
(74) *Attorney, Agent, or Firm* — Bruce J. Bowman

(57) ABSTRACT

A voltage reference selector, used in conjunction with a multi-meter, allows user selection of a reference voltage used by the multi-meter from three different reference voltages of an electrical control panel when taking electrical measurements from the electrical control panel via the multi-meter. A portable voltage reference selector is electrically connected to a multi-meter and temporarily electrically connected to voltage reference points of an electrical control panel for taking electrical measurements from the control panel with the multi-meter. In this form, a test lead from the multi-meter obtains electrical measurements from the control panel. A permanent voltage reference selector is permanently connected to voltage reference points of an electrical control panel and is electrically connectable to a multi-meter for taking electrical measurements from the control panel with the multi-meter. In this form, a test lead of the voltage reference selector obtains electrical measurements from the control panel.

19 Claims, 5 Drawing Sheets

VOLTAGE REFERENCE SELECTOR FOR USE IN CONJUNCTION WITH A MULTI-METER IN TAKING ELECTRICAL MEASUREMENTS FROM AN ELECTRICAL CONTROL PANEL

BACKGROUND OF THE INVENTION

1. Field of the Invention

The present invention relates to equipment for taking electrical measurements of electrical circuits, components and/or devices of an electrical control panel and, more particularly, to a device for use in conjunction with a multi-meter to aide in the taking of electrical measurement of an electrical control panel.

2. Background Information

Industrial control systems and other electrical intensive operations such as manufacturing, use control panels to host electrical components that allow various processes to be automated. The electrical control panel commonly uses terminal blocks primarily to provide termination points between field devices and components within the control panel. During system start-up or troubleshooting electrical engineers and technicians use multi-meters such as digital multi-meters (DMMs) to take voltage readings from the control panel and typically from the terminal blocks.

When taking electrical measurements of industrial control panel terminal blocks with current style test leads (both modular and non-modular), the engineer or technician must use two hands: one to hold the neutral probe (black in color according to industry standards) and one to hold the positive voltage probe (red in color according to industry standards). Because of this, there are no free hands to hold and/or operate the DMM or to write or take notes. This can create an awkward situation.

When taking electrical measurements off of an electrical control panel via a multi-meter, it is necessary to provide a voltage reference to the multi-meter from the control panel. Such voltage reference is one of three references, namely, ground, 0 volts DC, and 0 volts AC or neutral. For each reference voltage, it is necessary to connect the reference lead (i.e. black lead) from the "common" terminal of the multi-meter to the appropriate reference voltage on the electrical control panel. The test or positive lead (i.e. red lead) is connected to the volts/ohms/frequency or amps/milliamps terminal of the multi-meter and then contacted to the appropriate point on the electrical control panel. Each time the reference voltage needs to be changed for taking a particular electrical measurement from the electrical control panel, the reference lead must be moved.

The need to constantly move the reference lead from place to place on the electrical control panel can lead to confusion as to what reference voltage is being tapped or even where is the appropriate place to put the contact. This manner of taking electrical measurements from electrical control panels is also inefficient, thus causing such measurements to take a long time.

It is evident from the above that there is a need for a device that will enable a user to more efficiently take electrical measurements from an electrical control panel with a multi-meter.

It is also evident from the above that there is a need for a device that will allow a user to take electrical measurements from electrical control panels with a multi-meter without moving the reference voltage lead.

SUMMARY OF THE INVENTION

The present invention is a voltage reference selector, used in conjunction with a multi-meter, that allows user selection of a reference voltage to be used by the multi-meter from different reference voltages of an electrical control panel when taking electrical measurements from the electrical control panel via the multi-meter.

In one form, the voltage reference selector is portable so that it can be carried with and electrically connected to a multi-meter and be temporarily electrically connected to voltage reference points of an electrical control panel for taking electrical measurements from the electrical control panel with the multi-meter. In this form, a test lead from the multi-meter is used to obtain electrical measurements from the electrical control panel.

In another form, the voltage reference selector is permanently connected to voltage reference points of an electrical control panel and is electrically connectable to a multi-meter for taking electrical measurements from the electrical control panel with the multi-meter. In this form, a test lead of the voltage reference selector is used to obtain electrical measurements from the electrical control panel.

The present voltage reference selector is adapted to be connected to three voltage references on the electrical control panel and provides easy switching between the three reference voltages. This allows the user to use one hand to electrically probe (i.e. take electrical measurements from) the electrical control panel while providing one free hand.

The portable version includes a housing or box with a three position switch. A negative (e.g. black) lead having a multi-meter plug at one end extends from an output of the box and is connectable to the common terminal of the multi-meter. A first input lead (e.g. white lead) extends from the box and is connectable to a zero volts alternating current (0 V AC) reference on the electrical control panel. A second input lead (e.g. green lead) extends from the box and is connectable to a ground (G) reference on the electrical control panel. A third input lead (e.g. blue lead) extends from the box is connected to a zero volt direct current (0 V DC) reference on the electrical control panel. The colors preferably, but not necessarily, comply with the industry standard colors for voltage references. Once the leads are connected, a test or positive lead (e.g. red lead) is used to take electrical measurements from the electrical control panel. The box may include magnets or other temporary attachment mechanism on its underside for temporary attachment to the electrical control panel.

In the permanent version, the box includes the elements of the portable version with additions. One addition is the inclusion of a positive (e.g. red) lead having a multi-meter plug at one end that extends from the box and connects to the positive terminal of the multi-meter. Additionally, a positive (red) probe extends from the box, is electrically connected to the positive lead, and is used to take electrical measurements from the electrical control panel. The first, second and third input leads (e.g. the white, blue and green leads) are permanently connected to the appropriate voltage reference points on the electrical control panel as indicated above.

The present invention will be more apparent upon reading the following detailed description in conjunction with the accompanying drawings.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Like reference numerals indicate the same or similar parts throughout the figures.

DETAILED DESCRIPTION OF PREFERRED EMBODIMENTS

Figure 1:
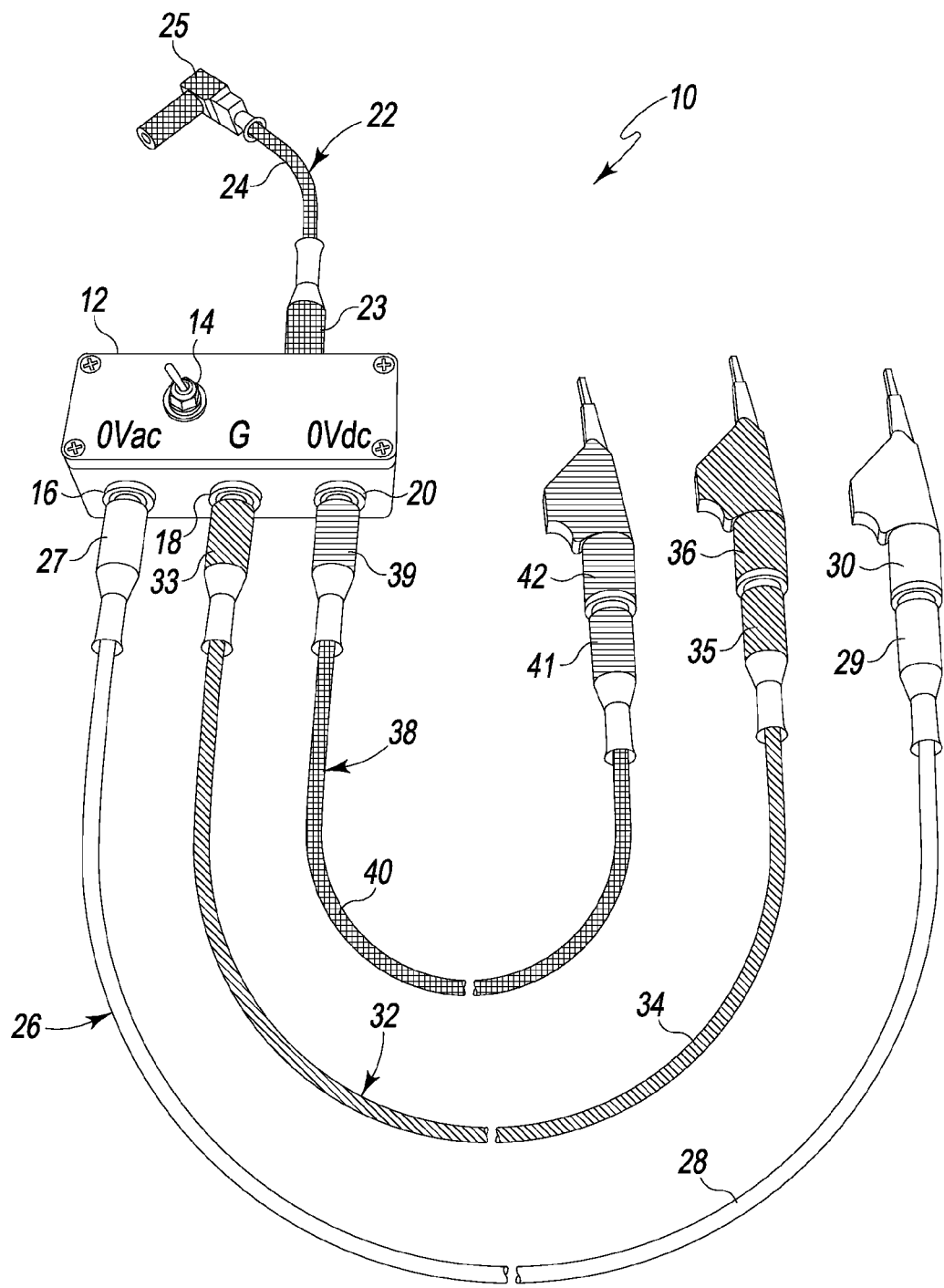
FIG. 1 is an isometric view of an embodiment of a voltage reference selector fashioned in accordance with the principles of the present invention and accompanying electrical leads for use with a multi-meter in taking electrical measurements from an electrical control panel.

Referring to FIG. 1, there is shown an exemplary embodiment of a voltage reference selector generally designated 10 along with various electrical leads (i.e. accompanying leads) described below fashioned in accordance with the principles of the present invention. As described below, the voltage reference selector 10 is designed for portable use with a multi-meter for taking electrical measurements from an electrical control panel. The voltage reference selector 10 includes a housing, box or enclosure 12 (housing 12) that may be made from metal, plastic or other material as desired. The housing 12 carries a switch 14, here shown as a toggle switch, but may be any type of switch. The switch 14 is a three-input, one output switch such that a selected input is provided to the output. The inputs and output of the switch 14 are internal to the housing 12 and thus are not seen.

The housing 12 includes a first input jack 16 that is electrically coupled or connected to one switch input of the three switch inputs. Since switch 14 is a toggle switch, the position of the toggle signifies the input selected and thus corresponds to the particular switch input to which the jack is electrically coupled. The first input jack 16 is preferably, but not necessarily, a standard female type jack but may be otherwise if desired. In all cases, the first input jack 16 is provided to releasably receive a plug of an electrical cable (as described below). The first input jack 16 is labeled via the housing as zero volts alternating current (0 V AC) and is thus intended to receive a zero volt AC reference voltage. Preferably, but not necessarily, the first input jack 16 is color coded to differentiate it from the other input jacks and allow quick connection of an input cable thereto. The first input jack 16 is color coded white (and thus per hatching standards is unhatched) as white is the industry standard color for zero volts AC cables. Of course, other colors may be used.

The housing 12 includes a second input jack 18 that is electrically coupled or connected to one switch input of the three switch inputs. Since switch 14 is a toggle switch, the position of the toggle signifies the input selected and thus corresponds to the particular switch input to which the jack is electrically coupled. The second input jack 18 is preferably, but not necessarily, a standard female type jack but may be otherwise if desired. In all cases, the second input jack 18 is provided to releasably receive a plug of an electrical cable (as described below). The second input jack 18 is labeled via the housing as ground (G) and is thus intended to receive a ground reference voltage. Preferably, but not necessarily, the second input jack 18 is color coded to differentiate it from the other input jacks and allow quick connection of an input cable thereto. The second input jack 18 is color coded green (and is thus hatched accordingly per hatching standards) as green is the industry standard color for ground cables. Of course, other colors may be used.

The housing 12 includes a third input jack 20 that is electrically coupled or connected to one switch input of the three switch inputs. Since switch 14 is a toggle switch, the position of the toggle signifies the input selected and thus corresponds to the particular switch input to which the jack is electrically coupled. The third input jack 20 is preferably, but not necessarily, a standard female type jack but may be otherwise if desired. In all cases, the third input jack 20 is provided to releasably receive a plug of an electrical cable (as described below). The third input jack 20 is labeled via the housing as zero volts direct current (0 V DC) and is thus intended to receive a zero volt DC reference voltage. Preferably, but not necessarily, the third input jack 20 is color coded to differentiate it from the other input jacks and allow quick connection of an input cable thereto. The third input jack 20 is color coded blue (and is thus hatched accordingly per hatching standards) as blue is the industry standard color for DC cables. Of course, other colors may be used.

The housing 12 also includes an output jack 21 (see FIG. 2) that is electrically coupled or connected to the switch output. The output jack 21 is preferably, but not necessarily, a standard female type jack but may be otherwise if desired. In all cases, the output jack is provided to releasably receive a plug of an electrical cable (as described below). Preferably, but not necessarily, the output jack 21 is color coded to differentiate it from the other jacks and allow quick connection of an output cable thereto. The output jack 21 is color coded black (and is thus hatched accordingly per hatching standards) as black is the industry standard color for common cable for multi-meters. Of course, other colors may be used. The output jack 21 is thus provided to allow connection to a common input of a multi-meter (as described below). It should be appreciated that the order and/or placement of the various jacks may be changed and that the terms first, second and third are arbitrary.

In order to allow electrical connection to an electrical control panel, electrical cables are used. A first or 0 V AC cable 26 is provided that is preferably, but not necessarily, color coded white in like manner to and reasons for the first input jack 16. The first cable 26 has a length of electrical cable 28, a plug 27 on one end thereof configured for releasable connection to the first input jack 16, and a plug 29 on another end thereof for preferably, but not necessarily, releasable connection to an electrical probe 30. The electrical probe 30 is designed to be inserted into a 0 V AC reference point of an electrical panel.

A second or G cable 32 is provided that is preferably, but not necessarily, color coded green in like manner to and reasons for the second input jack 18. The second cable 32 has a length of electrical cable 34, a plug 33 on one end thereof configured for releasable connection to the second input jack 18, and a plug 35 on another end thereof for preferably, but not necessarily, releasable connection to an electrical probe 36. The electrical probe 36 is designed to be inserted into a G reference point of an electrical panel.

A third or 0 V DC cable 38 is provided that is preferably, but not necessarily, color coded blue in like manner to and reasons for the third input jack 20. The third cable 38 has a length of electrical cable 40, a plug 39 on one end thereof configured for releasable connection to the third input jack 20, and a plug 41 on another end thereof for preferably, but not necessarily, releasable connection to an electrical probe 42. The electrical probe 42 is designed to be inserted into a 0 V DC reference point of an electrical panel.

In order to allow electrical connection to a multi-meter, an electrical cable is used. A first multi-meter cable 22 is provided that is preferably, but not necessarily, color coded black in like manner to and reasons for the output jack 21. The multi-meter cable 22 has a length of electrical cable 24, a plug 23 on one end thereof configured for releasable connection to the output jack 21, and a multi-meter plug 25 on another end thereof for releasable connection to a multi-meter input jack (see FIG. 2).

Thus, the electrical input from the probe 30 is provided to the multi-meter cable 22 and thus the multi-meter when the switch 14 is set to select the 0 V AC input, the electrical input from the probe 36 is provided to the multi-meter cable 22 and thus the multi-meter when the switch 14 is set to select the G input, and the electrical input from the probe 42 is provided to the multi-meter cable 22 and thus the multi-meter when the switch 14 is set to select the 0 V DC input.

It should be appreciated that the length of the cables may be different than shown. Moreover, the style of the plugs and probes may vary accordingly. Additionally, the housing 12 may enclose electronics (not shown) for conditioning, isolating or otherwise electrically connecting the inputs to the switch 14 and/or appropriately providing the inputs to and through the switch and to the multi-meter.

Figure 2:
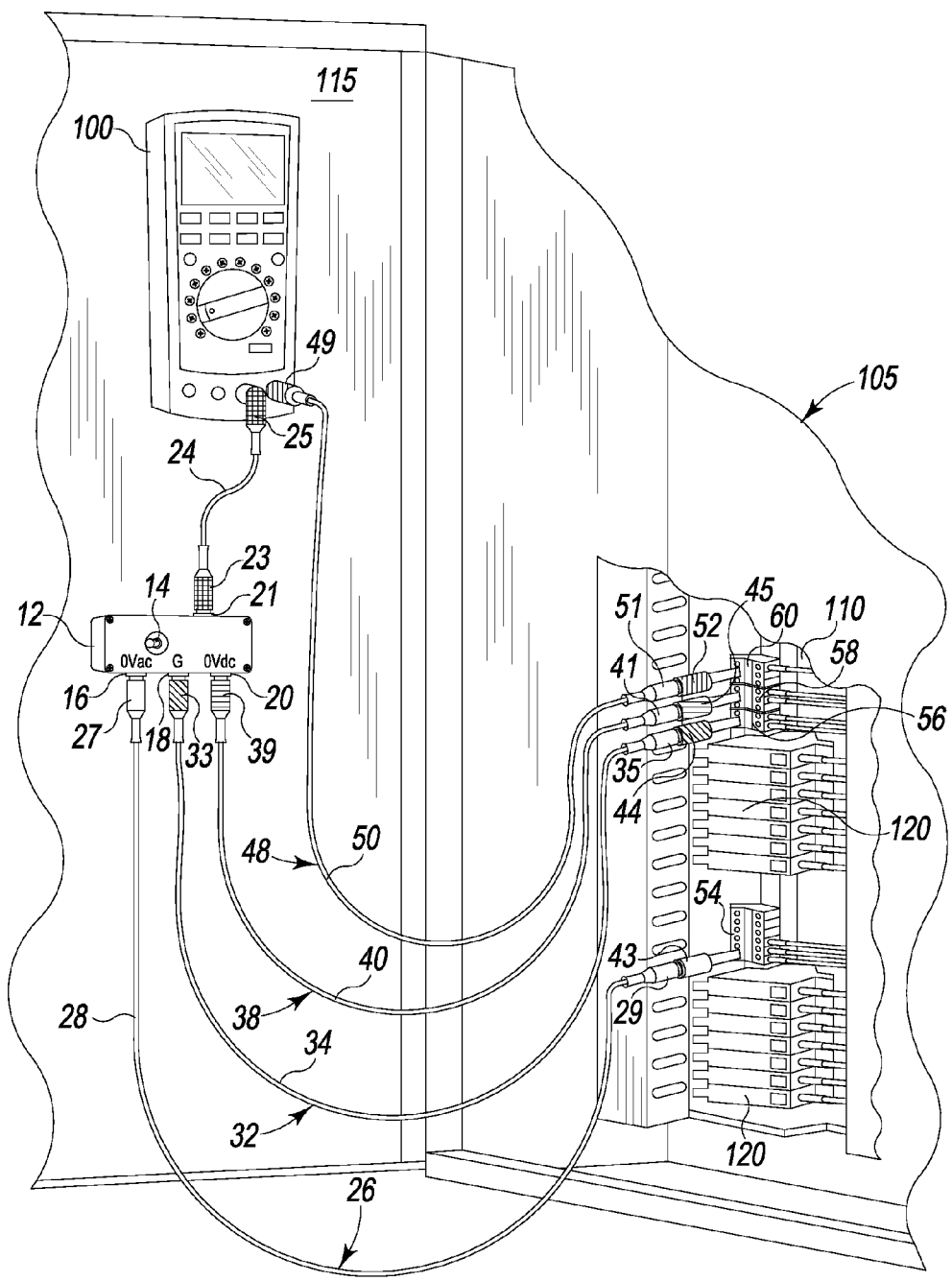
FIG. 2 is an isometric view of a portion of an open electrical control panel in which the voltage reference selector and accompanying electrical leads of FIG. 1 are shown in use with and connected to a multi-meter and to appropriate voltage reference points of the electrical control panel for taking electrical measurements from the electrical control panel by the multi-meter.

Referring to FIG. 2, the voltage reference selector 10 and accompanying input cables 26, 32 and 38 are shown in relation to a portion 110 of an electrical panel 105 having a plurality of terminal blocks 120 for obtaining voltage measurements from the electrical panel 105 via a multi-meter 100. The housing 12 of the voltage reference selector 10 is positioned proximate the multi-meter 100 which is shown hung (in a manner such as magnets or Velcro®) from the door 115 of the electrical control panel 105. The housing 12 may include magnets, Velcro® or the like on a rear surface thereof to allow the housing 12 to be releasably attached to the door 115. The output multi-meter cable 22 is connected to the output jack 21 and to the common input of the multi-meter 100. The 0 V AC cable 26 is connected to the 0 V AC input jack 16 of the voltage reference selector 10 and to an electrical probe 43 (shown as a different style probe than in FIG. 1 and not hatched to indicate the color white). The electrical probe 43 is connected to a 0 V AC reference point 54 of the electrical control panel 105. The G cable 32 is connected to the G input jack 18 of the voltage reference selector 10 and to an electrical probe 44 (shown as a different style probe than in FIG. 1 and hatched to indicate the color green). The electrical probe 44 is connected to a G reference point 56 of the electrical control panel 105. The 0 V DC cable 38 is connected to the 0 V DC input jack 20 of the voltage reference selector 10 and to an electrical probe 45 (shown as a different style probe than in FIG. 1 and hatched to indicate the color blue). The electrical probe 45 is connected to a 0 V DC reference point 58 of the electrical control panel 105.

Therefore, by utilizing the switch 14, the reference voltage supplied to the multi-meter 100 may be quickly changed to one of 0 V AC, G or 0 V DC without having to disconnect a probe from the electrical control panel and reconnecting it to another place on the electrical control panel. The user is then free to use a test lead 48 (color coded red), having a length of electrical cable 50, a plug 49 on one end thereof connected to a voltage input of the multi-meter and a plug 51 on another end thereof that is coupled to an electrical probe 52, for taking an electrical measurement of and/or from the electrical control panel 105 such as voltage point 60. Each time a different voltage point is desired to be measured the probe 52 is appropriately connected or contacted to the voltage point while the switch 14 is set to the appropriate setting. The multi-meter 100 is also set to an appropriate setting.

Figure 3:
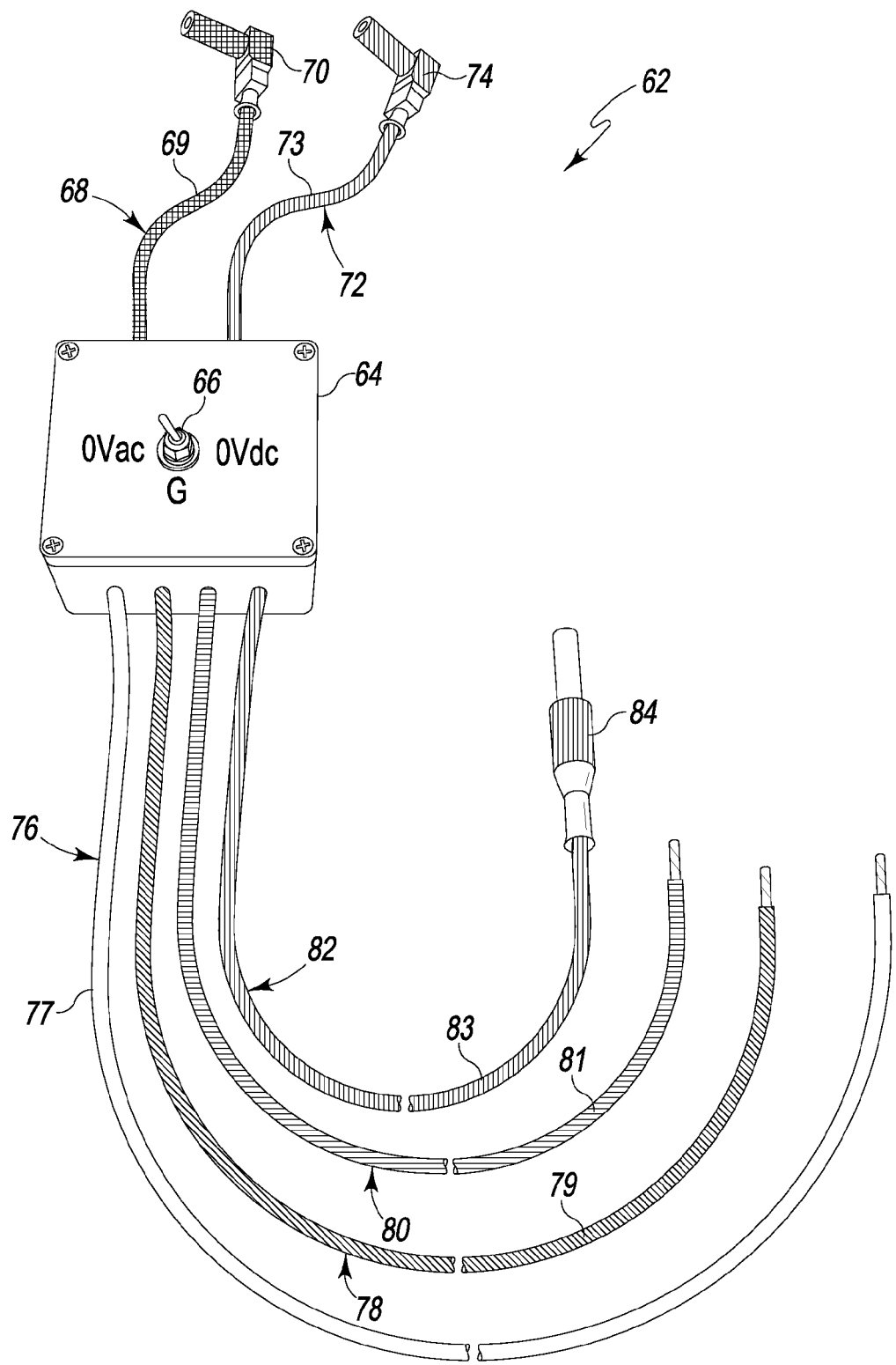
FIG. 3 is an isometric view of another embodiment of a voltage reference selector fashioned in accordance with the principles of the present invention and accompanying electrical leads for use with a multi-meter in taking electrical measurements from an electrical control panel.

Referring to FIG. 3, there is shown another exemplary embodiment of a voltage reference selector generally designated 62 along with various electrical leads (i.e. accompanying leads) described below fashioned in accordance with the principles of the present invention. As described below, the voltage reference selector 62 is designed for permanent placement in an electrical control panel and used with a multi-meter for taking electrical measurements from the electrical control panel. The voltage reference selector 62 includes a housing, box or enclosure 64 (housing 64) that may be made from metal, plastic or other material as desired. The housing 64 carries a switch 66, here shown as a toggle switch, but may be any type of switch. The switch 66 is a three-input, one output switch such that a selected input is provided to the output. The inputs and output of the switch 66 are internal to the housing 64 and thus are not seen. The three switch positions are labeled 0 V AC, G and 0 V DC to indicate the three voltage references that may be selected to provide same to the switch output.

The housing 64 includes a first electrical cable 76 having a length of cable 77 that is electrically coupled or connected to one switch input of the three switch inputs. Since switch 66 is a toggle switch, the position of the toggle signifies the input selected and thus corresponds to the particular switch input to which the cable is electrically coupled. The first cable 76 is preferably, but not necessarily, color coded to differentiate it from the other cables and allow proper connection to the electrical control panel. The first cable 76 is color coded white (and thus per hatching standards is unhatched) as white is the industry standard color for zero volts AC cables. Of course, other colors may be used. The end of the length of cable 77 terminates in bare wire for permanent connection to a 0 V AC reference point of the electrical control panel.

The housing 64 includes a second electrical cable 78 having a length of cable 79 that is electrically coupled or connected to one switch input of the three switch inputs. The second cable 78 is preferably, but not necessarily, color coded to differentiate it from the other cables and allow proper connection to the electrical control panel. The second cable 78 is color coded green (and thus per hatching standards is hatched) as green is the industry standard color for G cables. Of course, other colors may be used. The end of the length of cable 79 terminates in bare wire for permanent connection to a G reference point of the electrical control panel.

The housing 64 includes a third electrical cable 80 having a length of cable 81 that is electrically coupled or connected to one switch input of the three switch inputs. The third cable 80 is preferably, but not necessarily, color coded to differentiate it from the other cables and allow proper connection to the electrical control panel. The second cable 80 is color coded blue (and thus per hatching standards is hatched) as blue is the industry standard color for 0 V DC cables. Of course, other colors may be used. The end of the length of cable 81 terminates in bare wire for permanent connection to a 0 V DC reference point of the electrical control panel.

The housing 64 includes a fourth or test electrical cable 82 having a length of cable 83 that is electrically coupled or connected through the housing 64 to a second multi-meter cable 72 that extends from the housing 64. The fourth cable 82 is preferably, but not necessarily, color coded to differentiate it from the other cables and allow proper connection to the electrical control panel. The fourth cable 82 is color coded red (and thus per hatching standards is hatched) as red is the industry standard color for voltage test cables. Of course, other colors may be used. The end of the length of cable 83 terminates in a test probe 84 for contact with a voltage measurement point of the electrical control panel. The second multi-meter cable 72 is configured for attachment to a voltage input of the multi-meter and as such includes a length of cable 73 with a multi-meter plug 74 on its end. The second multi-meter cable is color coded red (and thus per hatching standards is hatched) as red is the industry standard color for multi-meter voltage cables. The test cables 82 and 72 provide a pass through of the voltage received by the probe 84 to the multi-meter via the housing 64.

The voltage reference selector 62 further includes a first multi-meter cable 68 that is preferably, but not necessarily, color coded black and hatched accordingly. The multi-meter cable 68 has a length of electrical cable 69 and a multi-meter plug 70 on another end thereof for releasable connection to a multi-meter input jack (see FIG. 4).

Thus, the electrical input from the cable 76 is provided to the multi-meter cable 68 and thus the multi-meter when the switch 66 is set to select the 0 V AC input, the electrical input from the cable 78 is provided to the multi-meter cable 68 and thus the multi-meter when the switch 66 is set to select the G input, and the electrical input from the cable 82 is provided to the multi-meter cable 68 and thus the multi-meter when the switch 66 is set to select the 0 V DC input.

It should be appreciated that the length of the cables may be different than shown. Moreover, the style of the plugs and probes may vary accordingly. Additionally, the housing 64 may enclose electronics (not shown) for conditioning, isolating or otherwise electrically connecting the inputs to the switch 66 and/or appropriately providing the inputs to and through the switch and to the multi-meter.

Figure 4:
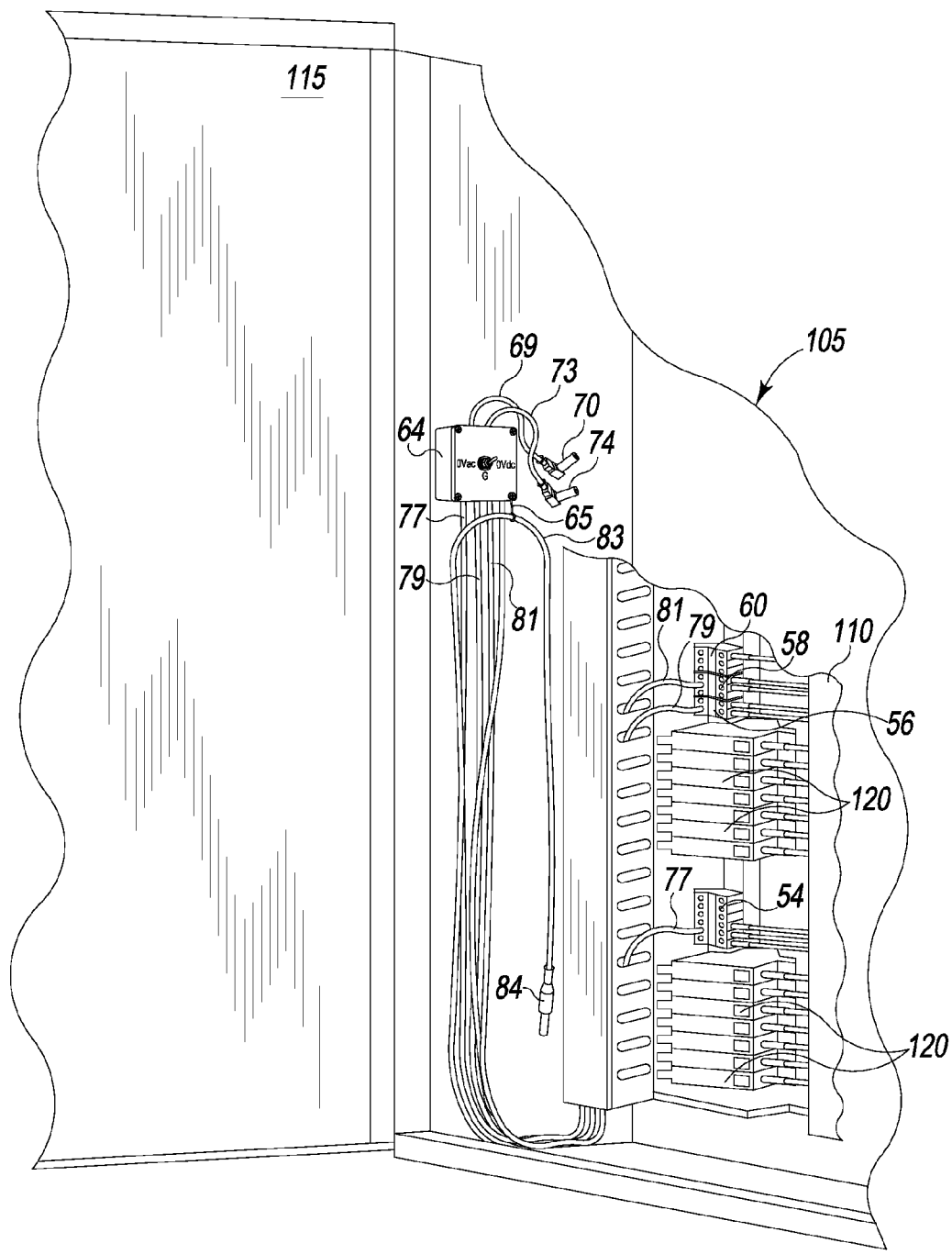
FIG. 4 is an isometric view of a portion of an open electrical control panel in which the voltage reference selector of FIG. 3 is initially situated before connection to a multi-meter for taking electrical measurements from the electrical control panel, the voltage reference leads of the accompanying leads connected to voltage reference points of the electrical control panel while the test lead of the accompanying leads hangs freely for use.

Referring to FIG. 4, the voltage reference selector 62 and accompanying input cables 77, 79 and 81 are shown permanently mounted in cabinet of the electrical panel 105. The housing 64 of the voltage reference selector 62 is releasably positioned on an inside wall of the cabinet The housing 64 may include magnets, Velcro® or the like on a rear surface thereof to allow the housing 64 to be releasably attached to the cabinet wall. The 0 V AC length of cable 77 is wired to the 0 V AC voltage reference point 54 of the electrical control panel 105. The G length of cable 79 is wired to the G voltage reference point 56 of the electrical control panel 105. The 0 V DC length of cable 81 is connected to the 0 V DC reference point 58 of the electrical control panel 105. The test length of cable 83 is hung via a hook 65 from the housing 66. The voltage reference selector 62 is thus installed and awaiting use.

Figure 5:
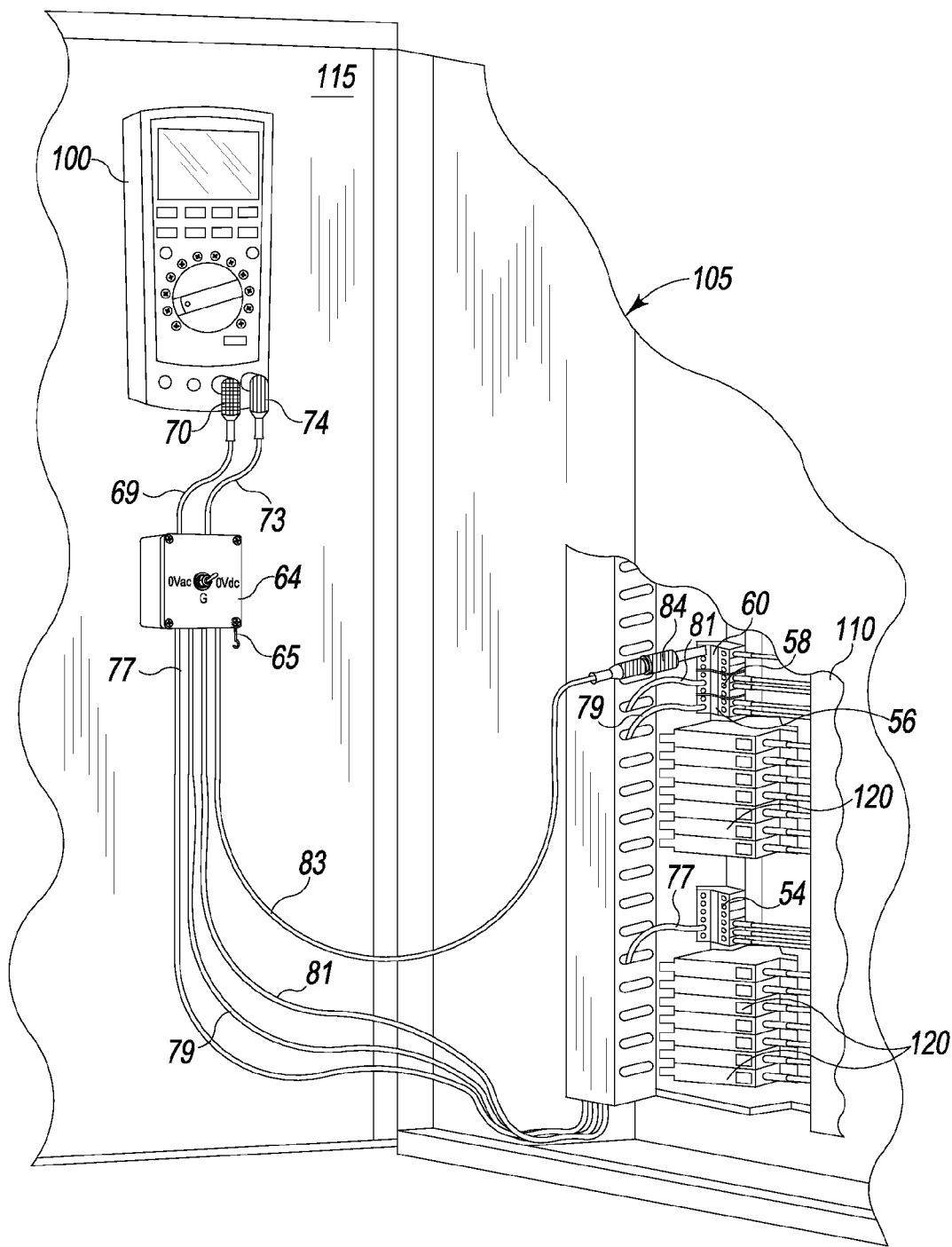
FIG. 5 is an isometric view of the portion of the open electrical control panel of FIG. 4 with the voltage reference selector thereof situated for use in conjunction with and connected to a multi-meter for taking electrical measurements from the electrical control panel, the voltage reference leads of the accompanying leads connected to the voltage reference points of the electrical control panel while the test lead of the accompanying leads is situated for electrical measurement from a component of the electrical control panel.

Referring to FIG. 5, the voltage reference selector 62 is shown in use with respect to the multi-meter 100. The housing 64 is moved proximate the multi-meter 100 and the two multi-meter cables from the voltage reference selector 62 are connected appropriately to the multi-meter. By utilizing the switch 6, the reference voltage supplied to the multi-meter 100 may be quickly changed to one of 0 V AC, G or 0 V DC without having to disconnect a probe from the electrical control panel and reconnecting it to another place on the electrical control panel. The user is then free to use the probe 84 of the test lead 83 (color coded red), to take an electrical measurement of and/or from the electrical control panel 105 such as voltage point 60. Each time a different voltage point is desired to be measured, the probe 84 is appropriately connected or contacted to the voltage point while the switch 66 is set to the appropriate setting. The multi-meter 100 is also set to an appropriate setting. Thereafter, the multi-meter is removed, the reference voltage selector 62 put back on the cabinet wall, and the test cable 83 hung back on the hook 65 of the housing 64 to be used again.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected.

What is claimed is:

1. A voltage reference selector for use in conjunction with a multi-meter in taking electrical measurements from an electrical control panel, the voltage reference selector comprising:

a housing;

a switch carried by the housing and having a first switch input, a second switch input, a third switch input and a first switch output;

a first voltage reference input carried by the housing and in electrical communication with the first switch input, the first voltage reference input configured to receive a first voltage reference cable electrically coupled to an AC voltage reference from an electrical control panel;

a second voltage reference input carried by the housing and in electrical communication with the second switch input, the second voltage reference input configured to receive a second voltage reference cable electrically coupled to a ground voltage reference from the electrical control panel;

a third voltage reference input carried by the housing and in electrical communication with the third switch input, the third voltage reference input configured to receive a third voltage reference cable electrically coupled to a DC voltage reference from the electrical control panel; and a first output carried by the housing and in electrical communication with the first switch output, the first output configured to receive a first multi-meter cable electrically coupled to a voltage reference input of a multi-meter;

the switch operable to selectively electrically connect inputs to the first, second and third switch inputs respectively from the first, second and third voltage reference cables to the first switch output for electrical connection to the multi-meter.

2. The voltage reference selector of claim 1, wherein:
the first voltage reference input is configured to receive the first voltage reference cable electrically coupled to a zero volt AC voltage reference from the electrical control panel;
the second voltage reference input is configured to receive the second voltage reference cable electrically coupled to a ground reference from the electrical control panel; and
the third voltage reference input is configured to receive the third voltage reference cable electrically coupled to a zero volt DC voltage reference from the electrical control panel.

3. The voltage reference selector of claim 1, wherein the first, second and third voltage reference inputs are color coded.

4. The voltage reference selector of claim 2, wherein the first voltage reference input is color coded white, the second voltage reference input is color coded green, and the third voltage reference input is color coded blue.

5. The voltage reference selector of claim 1, further comprising:
a test voltage input carried by the housing and configured to receive a test voltage cable for electrically probing a voltage from the electrical control panel; and
a test voltage output carried by the housing and electrically coupled to the test voltage input, the test voltage output configured to receive a second multi-meter cable electrically coupled to a voltage input of the multi-meter.

6. The voltage reference selector of claim 5, wherein the test voltage input is color coded.

7. The voltage reference selector of claim 6, wherein the test voltage input is color coded red.

8. A voltage reference selector for use in conjunction with a multi-meter in taking electrical measurements from an electrical control panel, the voltage reference selector comprising:
a housing;
a switch carried by the housing and having a first switch input, a second switch input, a third switch input and a first switch output;
a first voltage reference input jack carried by the housing and in electrical communication with the first switch input, the first voltage reference input jack receiving a first plug of a first voltage reference cable configured for electrical coupling to an AC voltage reference of an electrical control panel;
a second voltage reference input jack carried by the housing and in electrical communication with the second switch input, the second voltage reference input jack receiving a second plug of a second voltage reference cable configured for electrical coupling to a ground voltage reference of the electrical control panel;
a third voltage reference input jack carried by the housing and in electrical communication with the third switch input, the third voltage reference input jack receiving a third plug of a third voltage reference cable configured for electrical coupling to a DC voltage reference of the electrical control panel; and
a first output jack carried by the housing and in electrical communication with the first switch output, the first output jack configured to receive a first plug of a first multi-meter cable configured for electrical coupling to a voltage reference input of a multi-meter;
the switch operable to selectively electrically connect inputs to the first, second and third switch input jacks respectively from the first, second and third voltage reference cables to the first switch output jack for electrical connection to the multi-meter.

9. The voltage reference selector of claim 8, wherein:
the first voltage reference input jack is configured to receive the first plug of the first voltage reference cable configured for electrical coupling to a zero volt AC voltage reference of the electrical control panel;
the second voltage reference input jack is configured to receive the second plug of the second voltage reference cable configured for electrical coupling to a ground reference of the electrical control panel; and
the third voltage reference input jack is configured to receive the third plug of the third voltage reference cable electrically coupled to a zero volt DC voltage reference from the electrical control panel.

10. The voltage reference selector of claim 8, wherein the first, second and third voltage reference input jacks are color coded.

11. The voltage reference selector of claim 10, wherein the first voltage reference input jack is color coded white, the second voltage reference input jack is color coded green, and the third voltage reference input jack is color coded blue.

12. The voltage reference selector of claim 8, further comprising:
a test voltage input jack carried by the housing and configured to receive a test plug of a test voltage cable for electrically probing a voltage from the electrical control panel; and
a test voltage output jack carried by the housing and electrically coupled to the test voltage input jack, the test voltage output jack configured to receive a second plug of a second multi-meter cable electrically coupled to a voltage input of the multi-meter.

13. The voltage reference selector of claim 12, wherein the test voltage input jack is color coded.

14. The voltage reference selector of claim 13, wherein the test voltage input jack is color coded red.

15. A voltage reference selector for use in conjunction with a multi-meter in taking electrical measurements from an electrical control panel, the voltage reference selector comprising:
a housing;
a switch carried by the housing and having a first switch input, a second switch input, a third switch input and a first switch output;
a first voltage reference cable extending from the housing and in electrical communication with the first switch input, the first voltage reference cable configured to electrically connect to an AC voltage reference of an electrical control panel;
a second voltage reference cable extending from the housing and in electrical communication with the second switch input, the second voltage reference cable configured to electrically connect to a ground voltage reference of the electrical control panel;
a third voltage reference cable extending from the housing and in electrical communication with the third switch input, the third voltage reference cable configured to electrically connect to a DC voltage reference of the electrical control panel; and
a first output cable extending from the housing and in electrical communication with the first switch output, the first output cable having a first multi-meter plug configured to connect to a voltage reference input of a multi-meter;

the switch operable to selectively electrically connect the first, second and third voltage reference cables to the first output cable for electrical connection to the multi-meter.

16. The voltage reference selector of claim 15, wherein:

the first voltage reference cable is configured to electrically connect to a zero volt AC voltage reference of the electrical control panel;

the second voltage reference cable is configured to electrically connect to a ground reference of the electrical control panel; and the third voltage reference cable is configured to electrically connect to a zero volt DC voltage reference of the electrical control panel.

17. The voltage reference selector of claim 15, further comprising:

a test voltage input cable extending from the housing and configured to electrically connect to a voltage point of the electrical control panel; and a test voltage output cable extending from the housing and electrically coupled to the test voltage input cable, the test voltage output cable configured to electrically connect to a voltage input of the multi-meter.

18. The voltage reference selector of claim 17, wherein the first voltage reference cable, the second voltage reference cable, the third voltage reference cable, the first output cable, the test voltage input cable and the test voltage output cable are color coded.

19. The voltage reference selector of claim 18, wherein the first voltage reference cable is color coded white, the second voltage reference cable is color coded green, the third voltage reference cable is color coded blue, the first output cable is color coded black, and the test voltage input cable and the test voltage output cable are color coded red.

* * * * *